United States Patent
Abdel-Hafez et al.

(10) Patent No.: US 7,210,082 B1
(45) Date of Patent: Apr. 24, 2007

(54) METHOD FOR PERFORMING ATPG AND FAULT SIMULATION IN A SCAN-BASED INTEGRATED CIRCUIT

(75) Inventors: Khader S. Abdel-Hafez, San Francisco, CA (US); Laung-Terng (L.-T.) Wang, Sunnyvale, CA (US); Boryau (Jack) Sheu, San Jose, CA (US); Zhigang Wang, Sunnyvale, CA (US); Zhigang Jiang, San Jose, CA (US)

(73) Assignee: Syntest Technologies, Inc., Sunnyvale, CA (US)

( * ) Notice: Subject to any disclaimer, the term of this patent is extended or adjusted under 35 U.S.C. 154(b) by 137 days.

(21) Appl. No.: 11/140,579

(22) Filed: May 31, 2005

Related U.S. Application Data

(60) Provisional application No. 60/575,377, filed on Jun. 1, 2004.

(51) Int. Cl.
*G01R 31/28* (2006.01)
*G11B 5/00* (2006.01)
*G06F 11/00* (2006.01)

(52) U.S. Cl. .................. 714/726; 724/700; 724/741
(58) Field of Classification Search .................. None
See application file for complete search history.

(56) References Cited

U.S. PATENT DOCUMENTS 6,070,260 A * 5/2000 Buch et al. .................. 714/731
6,195,776 B1 2/2001 Ruiz et al.
6,470,483 B1 * 10/2002 Rodriguez et al. .............. 716/6
2004/0187058 A1 * 9/2004 Yamada et al. .............. 714/726

OTHER PUBLICATIONS

Lin et al, "Test Generation for Designs with Multiple Clocks," Proc. ACM/IEEE Design Automation Conf., Anaheim, California, pp. 662-667, Jun. 2-6, 2003.

* cited by examiner

*Primary Examiner*—Christine T. Tu
(74) *Attorney, Agent, or Firm*—Jim Zegeer

(57) ABSTRACT

A method for performing ATPG (automatic test pattern generation) and fault simulation in a scan-based integrated circuit, based on a selected clock order in a selected capture operation, in a selected scan-test mode or a selected self-test mode. The method comprises compiling 704 the RTL (register-transfer level) or Gate-Level HDL (hardware description language) code 701 based on the Input Constraints 702 and a Foundry Library 703, into a Sequential Circuit Model 705. The Sequential Circuit Model 705 is then transformed 706 into an equivalent Combinational Circuit Model 707 for performing Forward and/or Backward Clock Analysis 708 to determine the driving and observing clocks for all inputs and outputs of all combinational logic gates in the Combinational Circuit Model 707. The analysis results are used for Uncontrollable/Unobservable Labeling 709 of selected inputs and outputs of the combinational logic gates. Finally, ATPG and/or Fault Simulation 710 are performed according to the Uncontrollable/Unobservable Labeling 709 to generate the HDL Test Benches and ATE Test Programs 711.

10 Claims, 8 Drawing Sheets

PRIOR-ART #1

PRIOR-ART #2

PRIOR-ART #3

PRIOR-ART #4

METHOD FOR PERFORMING ATPG AND FAULT SIMULATION IN A SCAN-BASED INTEGRATED CIRCUIT

RELATED APPLICATION DATA

This application claims the benefit of U.S. Provisional Application No. 60/575,377 filed Jun. 1, 2004.

FIELD OF THE INVENTION

The present invention generally relates to the field of scan-based design and test using design-for-test (DFT) techniques. Specifically, the present invention relates to the field of Scan/ATPG (automatic test pattern generation), Logic BIST (built-in self-test), and Compressed Scan/ATPG.

BACKGROUND OF THE INVENTION

In this specification, the term integrated circuit is used to describe a chip or MCM (multi-chip module) embedded with DFT (design-for-test) techniques.

An integrated circuit generally contains multiple clock domains, with each clock domain being driven by a clock, which is either generated internally or supplied externally. Each clock domain further consists of a set of storage elements. Each clock is distributed to the set of storage elements belonging to the same clock domain via a skew-minimized network, which supplies clock pulses to all clock domain storage elements essentially at the same time. While the clock skew within a single clock domain is designed to be negligible, the clock skew between different clock domains can vary greatly for storage elements belonging to different clock domains. Two different types of combinational logic can be distinguished in an integrated circuit containing multiple clock domains. The first is intra-clock-domain combinational logic, which originates and terminates within the same clock domain. The second is inter-clock-domain combinational logic, which originates in one clock domain and terminates in a different clock domain.

Scan-based design is the most widely used design-for-test (DFT) approach for producing high-quality integrated circuits. Scan-based design requires that all storage elements in an integrated circuit, such as D flip-flops, be replaced with their scan-equivalent storage elements, such as Scan D flip-flops, otherwise known as scan cells. These scan cells are connected in such a way as to form one or more scan chains, with each scan chain being controlled by one or more scan enable (SE) signals and one or more clocks, each belonging to a different clock domain.

Testing a scan-based integrated circuit proceeds in a sequence of shift-in/shift-out operations and capture operations, which are repeated for a predetermined number of test patterns. During a shift operation, the scan enable (SE) signals are used to configure the scan cells into scan chains by selecting the scan data input as the input source for all scan cells in the scan-based integrated circuit, and a predetermined stimuli or a pseudorandom stimuli during scan-test and self-test, respectively, is shifted serially through the scan chains to all scan cells in the scan-based integrated circuit. During the capture operation, the scan enable (SE) signals are used to select the data inputs as the input source for all scan cells, to test the functional path of the scan-based integrated circuit using the stimulus loaded during the shift operation.

Automatic test pattern generation (ATPG) in conjunction to fault simulation are used to generate the scan data patterns to test faults in the scan-based integrated circuit, and to measure the fault coverage of the scan data patterns during scan-test. Fault simulation is also used independently to measure the fault coverage of pseudorandom stimuli during self-test. Faults tested include stuck-at faults, transition faults either launched from shift or launched from capture, path-delay faults either launched from shift or launched from capture, IDDQ (IDD quiescent current) faults, and bridging faults. In order to simplify the ATPG and fault simulation process, a cycle-based logic simulator, as opposed to a full timing logic simulator, is embedded within the ATPG and fault simulation engine, which is used to perform the logic simulation of the capture operation during scan-test or self-test. Since the clock skew between different clock domains can vary greatly, it makes it unfeasible to try to apply the clocks of different clock domains simultaneously during the capture operation, since the clock skew between the different clock domains would result in incorrect values being simulated by the cycle-based simulator when compared to results in the actual scan-based integrated circuit. Different approaches for applying the clocks during the capture operation have been developed in order to solve this problem.

Prior-art solution #1, see FIG. 2, is the one-hot approach. In this approach, only one clock is applied during any given capture operation. This clock is used to test the intra-clock-domain combinational logic originating and terminating within the clock domain of the given capture clock, as well as the inter-clock-domain combinational logic terminating in the clock domain of the given capture clock. The advantage of this approach is that by limiting the number of clocks applied during each capture operation to only one clock, the effects of clock skew between the different clock domains cannot negatively affect the results of the cycle-based logic simulator. The disadvantage of this approach is that only a small subset of the combinational logic that exists in a scan-based integrated circuit is tested during a single capture operation, which results in a large number of capture operations, requiring a large number of scan data patterns, being generated to test the complete scan-based integrated circuit.

Prior-art solution #2, see FIG. 3, is the staggered clock approach using multi-cycle simulation. In this approach, all the clocks are applied sequentially during every capture operation. A multi-cycle logic simulator is used to perform the logic simulation of the capture operation in order to be able to perform the ATPG and fault simulation of the staggered clocks. This allows us to test all intra-clock-domain combinational logic and inter-clock-domain combinational logic of the scan-based integrated circuit. The advantage of this approach is that by staggering the clocks and using a multi-cycle logic simulator, the effects of clock skew between the different clock domains cannot negatively affect the results of the multi-cycle logic simulator. A further advantage versus the one-hot approach is that all combinational logic is tested during each capture operation, which reduces the number of scan data patterns generated to test the scan-based integrated circuit. The disadvantage of this approach is that the complexity of the ATPG and fault simulation increases due to the multi-cycle logic simulator. This also increases the amount of time required to generate and fault grade the scan data patterns. Other variations of this approach also exist, where only a limited number of clocks are applied during each capture operation.

Prior-art solution #3, see FIG. 4, is the staggered clock approach using the circuit expansion approach proposed in the U.S. Patent Application 20020184560 by Wang et al. (2002). In this approach, all the clocks are applied sequentially during every capture operation. Circuit expansion is used to create a new circuit model where all clocks are applied simultaneously during the capture operation, while modeling the results of the logic simulation of the original circuit where all clocks are applied sequentially during the capture operation. This allows us to test all intra-clock-domain combinational logic and inter-clock-domain combinational logic of the scan-based integrated circuit. The advantage of this approach is that by performing circuit expansion, a simple ATPG and fault simulation engine can be used to generate and fault grade the scan data patterns while preventing the effects of clock skew between the different clock domains from negatively affect the results of the cycle-based logic simulator. A further advantage versus the one-hot approach is that all combinational logic is tested during each capture operation, which reduces the number of scan data patterns generated to test the scan-based integrated circuit. The disadvantage of this approach is that the circuit expansion results in a larger memory space requirement for the ATPG and fault simulation tool. Furthermore, the depth of the logic cone increases for clocks that are applied later in the capture operation, which increases the time it takes to generate and fault grade the scan data patterns for these clocks. This can also result in some faults becoming untestable due to the amount of backtracks required to search the depth of the expanded logic cones to find a pattern. Other variations of this approach also exist, where only a limited number of clocks are applied during each capture operation.

Prior-art solution #4, see FIG. 5, is the staggered clock approach using the primary capture event approach described in U.S. Pat. No. 6,195,776 by Ruiz et al. (2001). In this approach, all the clocks are applied sequentially during every capture operation. A selected clock is designated as the primary capture event (PCE) and all clocks are applied simultaneously during the capture operation simulation. A cycle-based logic simulator is used to perform a logic simulation with respect to the PCE clock. In order to guarantee that the cycle-based logic simulator can accurately predict the results in the actual scan-based integrated circuit where clocks are applied sequentially, all scan cells are analyzed with respect to the PCE clock to determine whether they can be controlled and observed at the time of the primary capture event. Scan cells that are driven by the PCE clock are labeled as both controllable and observable. Scan cells driven by clocks that are applied before the PCE clock are labeled as uncontrollable, since their value cannot be predicted at the time of the primary capture event. Scan cells driven by clocks that are applied after the PCE clock are labeled as unobservable, since the values captured into these storage elements cannot be correctly determined at the time of the primary capture event.

The advantage of this approach is that by selecting a PCE clock and labeling scan cells as controllable and/or observable with respect to the primary capture event, a simple ATPG and fault simulation engine can be used to generate and fault grade the scan data patterns while preventing the effects of clock skew between the different clock domains from negatively affect the results of the cycle-based logic simulator. A further advantage versus the multi-cycle simulation and circuit expansion approaches is that this approach does not require any additional complexity or memory space. The disadvantage of this approach is that only a subset of the inter-clock-domain combinational logic is tested during any given capture operation, which increases the number of scan data patterns when compared to the multi-cycle simulation and circuit expansion approaches. A further disadvantage is that a larger number of expected unknown ('x') values can be generated, which can create difficulties for existing scan compression solutions. Other variations of this approach also exist, where only a limited number of clocks are applied during each capture operation.

Reference is made to the following:

U.S. PATENT DOCUMENTS

U.S. Pat. No. 6,195,776 February 2001 Ruiz et al. 714/738; 703/22; 714/726
20020184560 December 2002 Wang et al. 714/25

OTHER PUBLICATIONS

X. Lin and R. Thompson, "Test Generation for Designs with Multiple Clocks," Proc. ACM/IEEE Design Automation Conf., Anaheim, Calif., pp. 662–667, Jun. 2–6, 2003.

L.-T. Wang, K. S. Abdel-Hafez, X. Wen, B. Sheu, and S.-M. Wang, "Smart ATPG (Automatic Test Pattern Generation) for Scan-Based Integrated Circuits," U.S. patent application Ser. No. 10/850,460, Filed May 24, 2004.

Therefore, there is a need for an improved ATPG and fault simulation, comprising a method and a computer-aided design (CAD) system, that is capable of achieving high fault coverage using an optimum set of test vectors within reasonable complexity, memory space and CPU time.

SUMMARY OF THE INVENTION

Accordingly, the main purpose of the present invention is to provide such an improved ATPG and fault simulation method that does not require any additional complexity or memory space. A further objective is to maximize the number of inter-clock-domain combinational logic that can be tested during every capture operation in order to reduce the number of scan data patterns, for testing the scan-based integrated circuit. We achieve this by applying all the clocks sequentially during the applied capture operation, while applying all the clocks simultaneously during the simulated capture operation, and using a general circuit analysis approach, to determine the best nodes, which are inputs or outputs of any combinational logic gate or scan cell, to be labeled as uncontrollable and/or unobservable, in order to allow us to test inter-clock-domain combinational logic while preventing the effects of clock skew between the different clock domains from negatively affecting the results of the cycle-based logic simulator.

A forward and backward clock analysis of all the nodes in the scan-based integrated circuit is performed to determine the driving and observing clocks of all inter-clock-domain combinational logic. This allows us to determine the precise nodes that need to be set as uncontrollable and unobservable based on the order of the clocks during the capture operation, which further allows us to label the smallest number of intra-clock-domain combinational logic and inter-clock-domain combinational logic and as uncontrollable or unobservable to implement this solution, which reduces the number of vectors used to test the scan-based integrated circuit. Other variations of this approach also exist, where only a forward or backward clock analysis is performed, or where the nodes that are allowed to be set as either uncontrollable or unobservable are limited to the inputs and outputs of scan cells.

Following this clock analysis, the order of the clocks in the capture operation, which is either pre-specified or determined dynamically, is used to set the appropriate unobservable and uncontrollable nodes. An inter-clock domain combinational logic node driven by a clock that is applied earlier in the capture operation, and observed by a clock that is applied later in the capture operation can either be marked as uncontrollable or unobservable, since the values stored in scan cells that drive the inter-clock-domain combinational logic node may have changed after applying the early clock. Since some nodes dominate others, not all nodes have to be set in this manner. This gives us the flexibility to select the nodes to label as uncontrollable or unobservable in a way that minimizes the number of expected unknown ('x') values that are generated, which allows this approach to be used for existing scan compression solutions. This can further allow us to select the nodes to label as uncontrollable or unobservable in a way that maximizes the amount of intra-clock-domain combinational logic and inter-clock-domain combinational logic that can be tested during each capture operation, which can further reduce the number of scan data patterns used for testing the scan-based integrated circuit.

Another aspect of this invention comprises performing circuit remodeling, in order to decouple nodes that are driven or observed by multiple clocks. For example, a node that is driven by an early clock, applied earlier in the capture operation, and observed by the same early clock, as well as a late clock, applied later in the capture operation, can be labeled as unobservable. However, labeling this node as unobservable will not allow us to test the intra-clock-domain combinational logic driven by this node. Remodeling the circuit by splitting this node into two separate nodes, one driving only intra-clock-domain combinational logic and the other driving only inter-clock-domain combinational logic allows us to maximize the amount of combinational logic that can be tested during each capture operation, which reduces the number of scan data patterns used to test the scan-based integrated circuit.

BRIEF DESCRIPTION OF THE DRAWINGS

The above and other objects, advantages and features of the invention will become more apparent when considered with the following specification and accompanying drawings wherein.

DETAILED DESCRIPTION OF THE INVENTION

The following description is presently contemplated as the best mode of carrying out the present invention. This description is not to be taken in a limiting sense but is made merely for the purpose of describing the principles of the invention. The scope of the invention should be determined by referring to the appended claims.

Figure 1A:
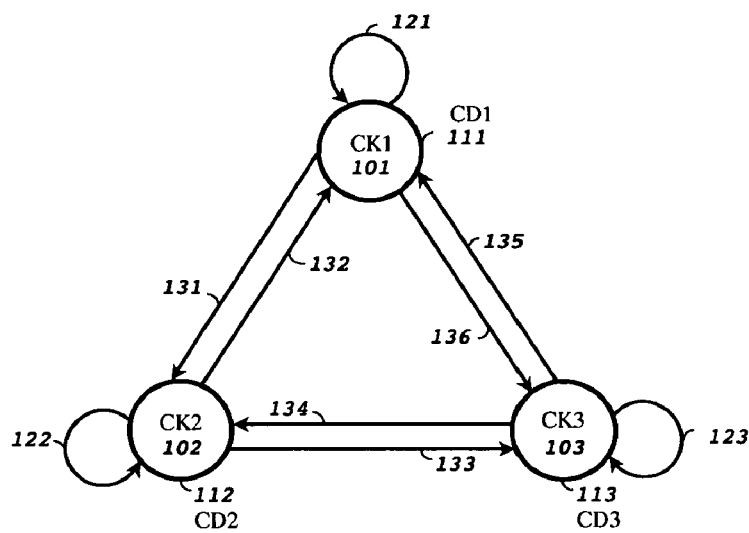
FIG. 1A shows a block diagram of a scan-based integrated circuit comprising three clocks, three clock domains, three types of intra-clock-domain combinational logic, and six types of inter-clock-domain combinational logic.

FIG. 1A shows a block diagram of a scan-based integrated circuit comprising three clocks 101, 102 and 103, three clock domains 111, 112 and 113, three types of intra-clock-domain combinational logic 121, 122 and 123, and six types of inter-clock-domain combinational logic 131, 132, 133, 134, 135 and 136. Three clocks CK1 101, CK2 102 and CK3 103 drive three clock domains CD1 111, CD2 112 and CD3 113 each consisting of one or more scan cells. The three types of intra-clock-domain combinational logic are as follows. Scan cells belonging to CD1 111 drive intra-clock-domain combinational logic 121, which is observed by scan cells belonging to CD1 111. Scan cells belonging to CD2 112 drive intra-clock-domain combinational logic 122, which is observed by scan cells belonging to CD2 112. And scan cells belonging to CD3 113 drive intra-clock-domain combinational logic 123, which is observed by scan cells belonging to CD3 113. The six types of inter-clock-domain combinational logic are as follows. Scan cells belonging to CD1 111 drive inter-clock-domain combinational logic 131, which is observed by scan cells belonging to CD2 112. Scan cells belonging to CD2 112 drive inter-clock-domain combinational logic 132, which is observed by scan cells belonging to CD1 111. Scan cells belonging to CD2 112 drive inter-clock-domain combinational logic 133, which is observed by scan cells belonging to CD3 113. Scan cells belonging to CD3 113 drive inter-clock-domain combinational logic 134, which is observed by scan cells belonging to CD2 112. Scan cells belonging to CD3 113 drive inter-clock-domain combinational logic 135, which is observed by scan cells belonging to CD1 111. And scan cells belonging to CD1 111 drive inter-clock-domain combinational logic 136, which is observed by scan cells belonging to CD3 113.

Figure 1B:
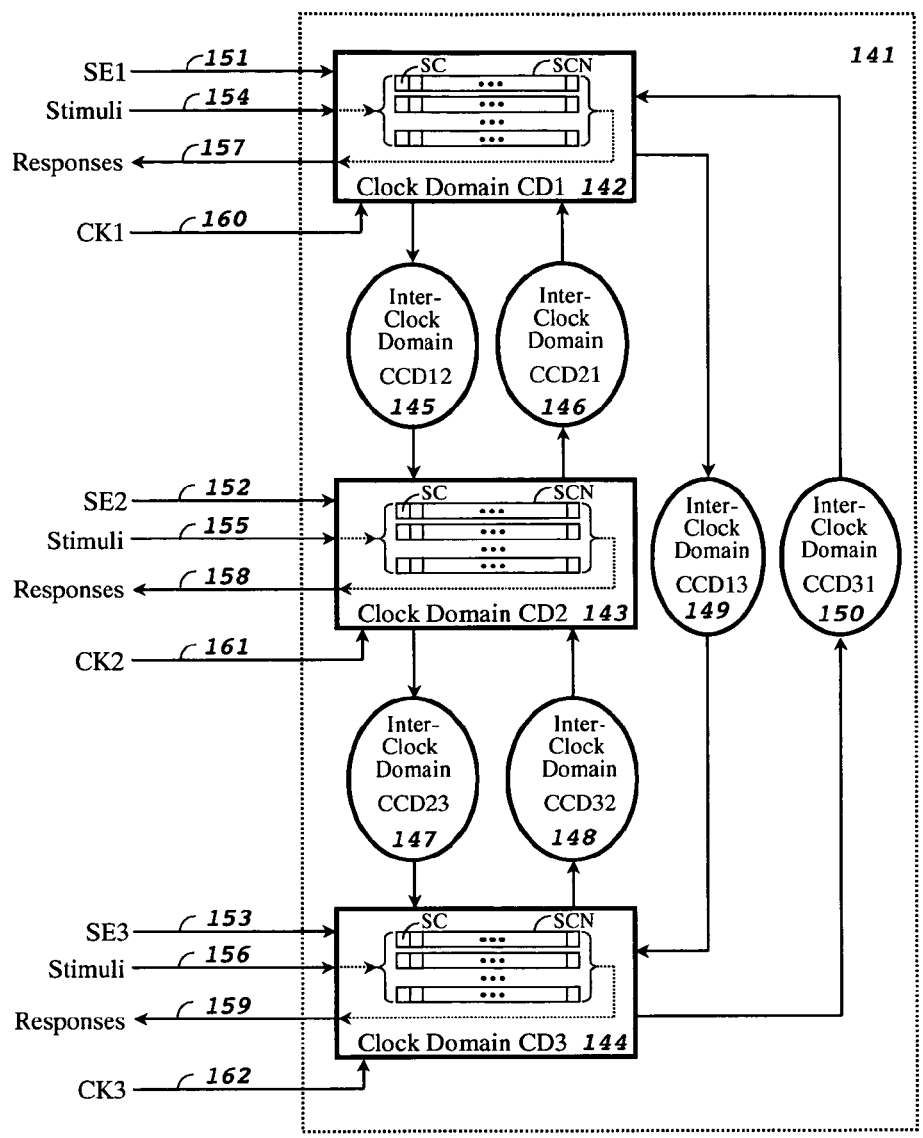
FIG. 1B shows a circuit diagram of a scan-based integrated circuit comprising three clocks, three clock domains, and six types of inter-clock-domain combinational logic blocks.

FIG. 1B shows a circuit diagram of a scan-based integrated circuit comprising three clocks, three clock domains, and six types of inter-clock-domain combinational logic blocks. The scan-based integrated circuit 141 is tested using three clocks CK1 160, CK2 161 and CK3 162, three scan enable signals SE1 151, SE2 152 and SE3 153, which can be controlled by a global scan enable signal, and Stimuli 154, 155 and 156. All responses are observed on Responses 157, 158 and 159, which is driven out of the scan-based integrated circuit to be compared on an external tester during scan-test or compacted into a signature during self-test.

The scan-based integrated circuit 141 comprises three clock domains CD1 142, CD2 143 and CD3 144. Each clock domain comprises a number of scan chains SCN, with each scan chain comprising a number of scan cells SC. The six types of inter-clock-domain combinational logic are as follows. Scan cells belonging to CD1 142 drive inter-clock-domain combinational logic CCD12 145, which is observed by scan cells belonging to CD2 143. Scan cells belonging to CD2 143 drive inter-clock-domain combinational logic CCD21 146, which is observed by scan cells belonging to CD1 142. Scan cells belonging to CD2 143 drive inter-clock-domain combinational logic CCD23 147, which is observed by scan cells belonging to CD3 144. Scan cells belonging to CD3 144 drive inter-clock-domain combinational logic CCD32 148, which is observed by scan cells belonging to CD2 143. Scan cells belonging to CD3 144 drive inter-clock-domain combinational logic CCD31 150, which is observed by scan cells belonging to CD1 142. And scan cells belonging to CD1 142 drive inter-clock-domain combinational logic CCD13 149, which is observed by scan cells belonging to CD3 144.

Figure 2:
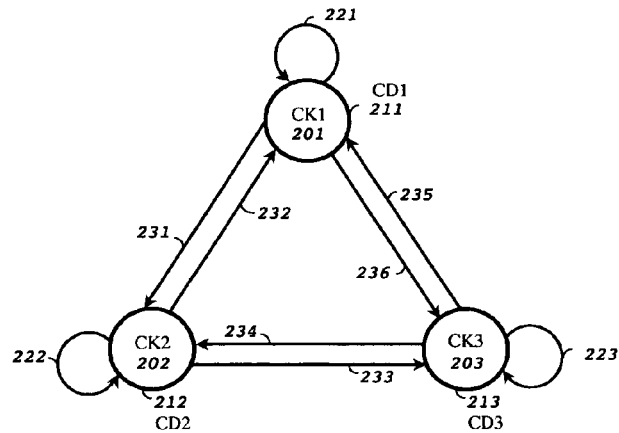
FIG. 2 shows a block diagram and a timing diagram of a scan-based integrated circuit, used to implement prior-art solution #1 for performing ATPG and fault simulation using the one-hot approach.
Figure 2:
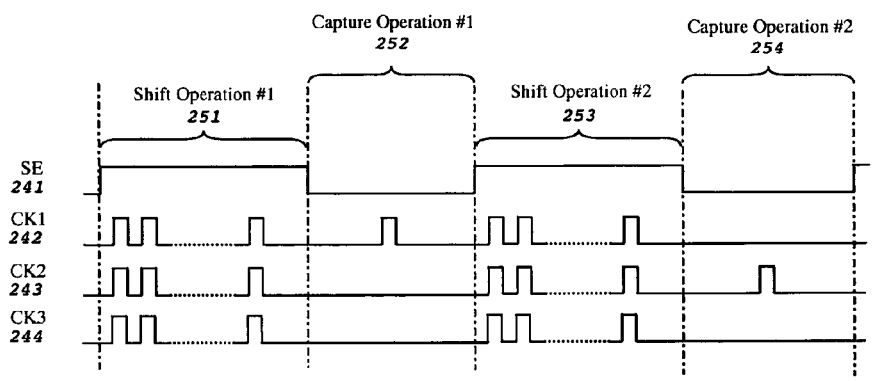

FIG. 2 shows a block diagram and a timing diagram of a scan-based integrated circuit, used to implement prior-art solution #1 for performing ATPG and fault simulation using the one-hot approach. The block diagram of the scan-based integrated circuit comprises three clocks CK1 201, CK2 202 and CK3 203, three clock domains CD1 211, CD2 212 and CD3 213, three types of intra-clock-domain combinational logic 221, 222 and 223, and six types of inter-clock-domain combinational logic 231, 232, 233, 234, 235 and 236, as described in FIG. 1.

From the associated timing diagram, it can be seen that scan-test or self-test implemented based on the one-hot approach proceeds in a sequence of shift operations 251 and 253, and capture operations 252 and 254. During shift operations Shift Operation #1 251 and Shift Operation #2 253, clocks CK1 201, CK2 202 and CK3 203 are applied simultaneously as shown in waveforms 242, 243 and 244 respectively, while scan enable SE 241 is held active to configure all the scan cells in clock domains CD1 211, CD2 212 and CD3 213 into scan chains by selecting the scan data input as the input source for all scan cells in the scan-based integrated circuit, and a predetermined stimuli or a pseudorandom stimuli during scan-test and self-test, respectively, is shifted serially through the scan chains to all scan cells in the scan-based integrated circuit.

During capture operations Capture Operation #1 252 and Capture Operation #2 254, only clock CK1 201 is applied during the first capture operation and only clock CK2 202 is applied during the second capture operation as shown in waveforms 242, 243 and 244, while scan enable SE 241 is held inactive to select the data inputs as the input source for all scan cells in clock domains CD1 211, CD2 212 and CD3 213, to test the combinational logic of the scan-based integrated circuit using the stimulus loaded during the shift operation.

Since only CK1 201 is applied during Capture Operation #1 252, only combinational logic observed by scan cells in clock domain CD1 211 can be tested during this capture operation, which limits the tested combinational logic to intra-clock-domain combinational logic 221, inter-clock-domain combinational logic 232 and inter-clock-domain combinational logic 235. Similarly, since only CK2 202 is applied during Capture Operation #2 254, only combinational logic observed by scan cells in clock domain CD2 212 can be tested during this capture operation, which limits the tested combinational logic to intra-clock-domain combinational logic 222, inter-clock-domain combinational logic 231 and inter-clock-domain combinational logic 234. A similar analysis can be performed for capture operations where only CK3 203 is applied.

Figure 3:
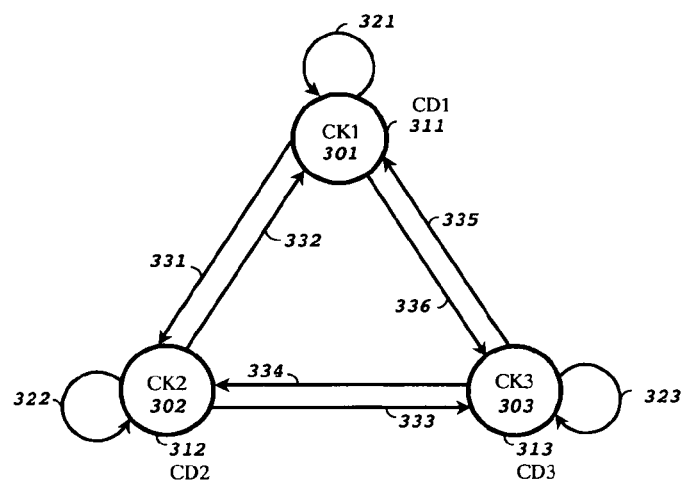
FIG. 3 shows a block diagram and a timing diagram of a scan-based integrated circuit, used to implement prior-art solution #2 for performing ATPG and fault simulation using the multi-cycle simulation approach.
Figure 3:
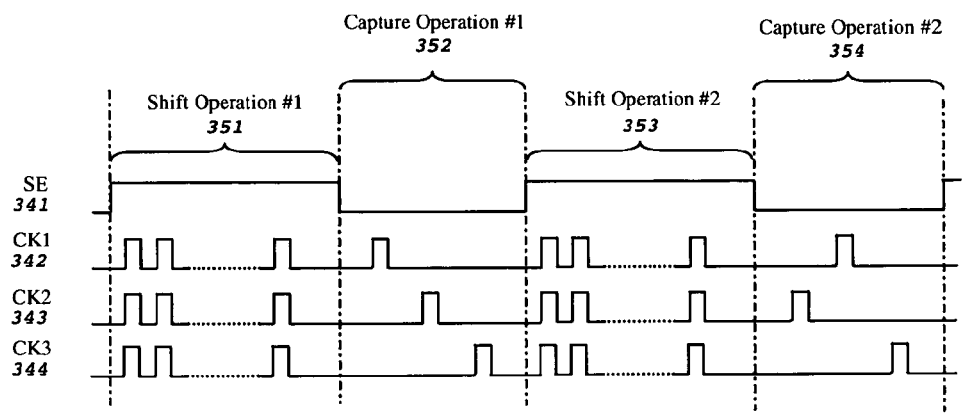

FIG. 3 shows a block diagram and a timing diagram of a scan-based integrated circuit, used to implement prior-art solution #2 for performing ATPG and fault simulation using the multi-cycle simulation approach. The block diagram of the scan-based integrated circuit comprises three clocks CK1 301, CK2 302 and CK3 303, three clock domains CD1 311, CD2 312 and CD3 313, three types of intra-clock-domain combinational logic 321, 322 and 323, and six types of inter-clock-domain combinational logic 331, 332, 333, 334, 335 and 336, as described in FIG. 1.

From the associated timing diagram, it can be seen that scan-test or self-test implemented based on the multi-cycle simulation approach proceeds in a sequence of shift operations 351 and 353, and capture operations 352 and 354. During shift operations Shift Operation #1 351 and Shift Operation #2 353, clocks CK1 301, CK2 302 and CK3 303 are applied simultaneously as shown in waveforms 342, 343 and 344 respectively, while scan enable SE 341 is held active to configure all the scan cells in clock domains CD1 311, CD2 312 and CD3 313 into scan chains by selecting the scan data input as the input source for all scan cells in the scan-based integrated circuit, and a predetermined stimuli or a pseudorandom stimuli during scan-test and self-test, respectively, is shifted serially through the scan chains to all scan cells in the scan-based integrated circuit.

During capture operations Capture Operation #1 352 and Capture Operation #2 354, clocks CK1 301, CK2 302 and CK3 303 are applied sequentially as shown in waveforms 342, 343 and 344, while scan enable SE 341 is held inactive to select the data inputs as the input source for all scan cells in clock domains CD1 311, CD2 312 and CD3 313, to test the combinational logic of the scan-based integrated circuit using the stimulus loaded during the shift operation. A multi-cycle logic simulator is used to perform the logic simulation of the capture operations in order to be able to perform the ATPG and fault simulation of the staggered clocks. This allows us to test all intra-clock-domain combinational logic and inter-clock-domain combinational logic of the scan-based integrated circuit. As shown in waveforms 342, 343 and 344, the order of the clocks can be varied during each capture operation, to make it easier to test the combinational logic associated with different clock domains in different capture operations.

Figure 4:
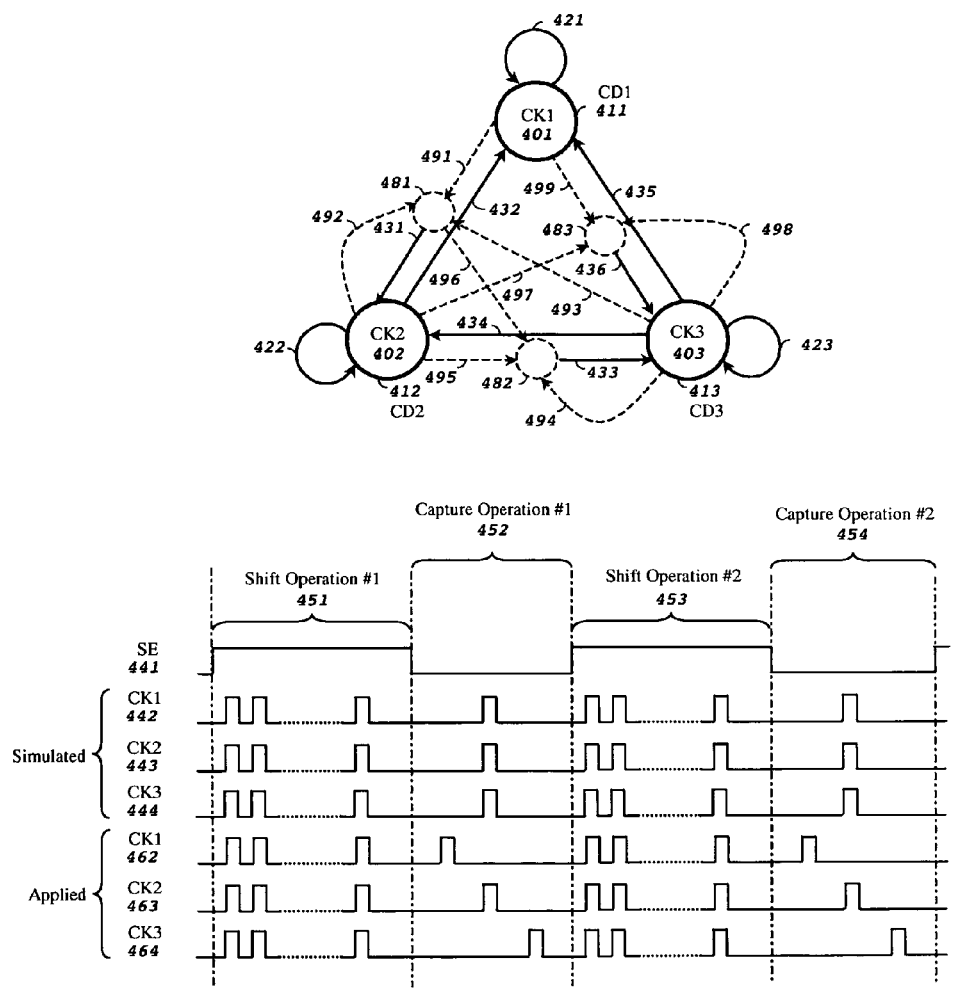
FIG. 4 shows a block diagram and a timing diagram of a scan-based integrated circuit, used to implement prior-art solution #3 for performing ATPG and fault simulation using the circuit expansion approach proposed in the US Patent Application 20020184560 by Wang et al. (2002)

FIG. 4 shows a block diagram and a timing diagram of a scan-based integrated circuit, used to implement prior-art solution #3 for performing ATPG and fault simulation using the circuit expansion approach proposed in the US Patent Application 20020184560 by Wang et al. (2002). The block diagram comprises the three original clocks CK1 401, CK2 402 and CK3 403, three original clock domains CD1 411, CD2 412 and CD3 413, three original types of intra-clock-domain combinational logic 421, 422 and 423, and six original types of inter-clock-domain combinational logic 431, 432, 433, 434, 435 and 436, found in the original scan-based integrated circuit, as described in FIG. 1. In addition, this block diagram comprises remodeled transparent clock domains TCD12 481, TCD23 482 and TCD13 483, and remodeled intra-clock domain and inter-clock-domain combinational logic 491 to 499.

From the associated timing diagram, it can be seen that scan-test or self-test implemented based on the circuit expansion approach proceeds in a sequence of shift operations 451 and 453, and capture operations 452 and 454. During shift operations Shift Operation #1 451 and Shift Operation #2 453, clocks CK1 401, CK2 402 and CK3 403 are applied simultaneously as shown in waveforms 442/462, 443/463, and 444/464 respectively, while scan enable SE 441 is held active to configure all the scan cells in clock domains CD1 411, CD2 412 and CD3 413 into scan chains by selecting the scan data input as the input source for all scan cells in the scan-based integrated circuit, and a predetermined stimuli or a pseudorandom stimuli during scan-test and self-test, respectively, is shifted serially through the scan chains to all scan cells in the scan-based integrated circuit.

During capture operations Capture Operation #1 452 and Capture Operation #2 454, clocks CK1 401, CK2 402 and CK3 403 are applied sequentially as shown in waveforms 462, 463 and 464, while scan enable SE 441 is held inactive to select the data inputs as the input source for all scan cells in clock domains CD1 411, CD2 412 and CD3 413, to test the combinational logic of the scan-based integrated circuit using the stimulus loaded during the shift operation. However, during ATPG and fault simulation, clocks CK1 401, CK2 402 and CK3 403 are applied simultaneously as shown in waveforms 442, 443 and 444. The circuit expansion shown in the block diagram is used to guarantee that the simulated results match the actual results. Since circuit expansion is an elaborate process that depends on the order in which the clocks are applied, typically only one clock order is used to perform ATPG and fault simulation. The clock order shown in waveforms 462, 463 and 464 is CK1 401 followed by CK2 402 followed by CK3 403.

From the block diagram, it can be seen that the circuit expansion based on the specified clock order is as follows. First, a new transparent clock domain TCD12 481 is added, to model scan cells that drive inter-clock-domain combinational logic 431 originally driven by CD1 411 and observed by CD2 412. TCD12 481 is used to model the fact that CK1 401 is applied before CK2 402, by adding transparent scan cells in place of scan cells in CD1 411 that originally drive inter-clock-domain combinational logic 431, and expanding the circuit to add new combinational logic 491 driven by CK1 401, 492 driven by CK2 402 and 493 driven by CK3 403, to recreate the combinational logic driving the transparent scan cells in TCD12 481. This process creates two levels of logic and transparent scan cells to guarantee that the simulated results captured using CK2 402 in CD2 412 match the actual results. A similar, but more elaborate, circuit expansion is used to guarantee that the simulated results captured using CK3 403 in CD3 413 match the actual results, since paths from both CD2 412 to CD3 413 and CD1 411 to CD3 413 have to be covered.

As noted above, the disadvantage of this approach is that the circuit expansion results in a larger memory space requirement for ATPG and fault simulation. Furthermore, the depth of the logic cone increases for clocks that are applied later in the capture operation such as CK3 403, which increases the time it takes to generate and fault grade the scan data patterns for these clocks. This can be seen in the circuit expansion process from CD2 412 to CD3 413, which might also involve going through both TCD23 482 and TCD12 481. This can result in some faults becoming untestable due to the amount of backtracks required to search the depth of the expanded logic cones to find a pattern.

Figure 5:
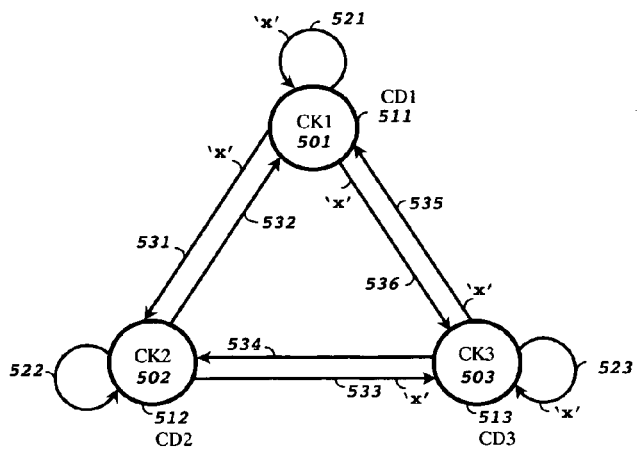
FIG. 5 shows a block diagram and a timing diagram of a scan-based integrated circuit, used to implement prior-art solution #4 for performing ATPG and fault simulation using the primary capture event (PCE) approach proposed in the U.S. Pat. No. 6,195,776 by Ruiz et al. (2001)
Figure 5:
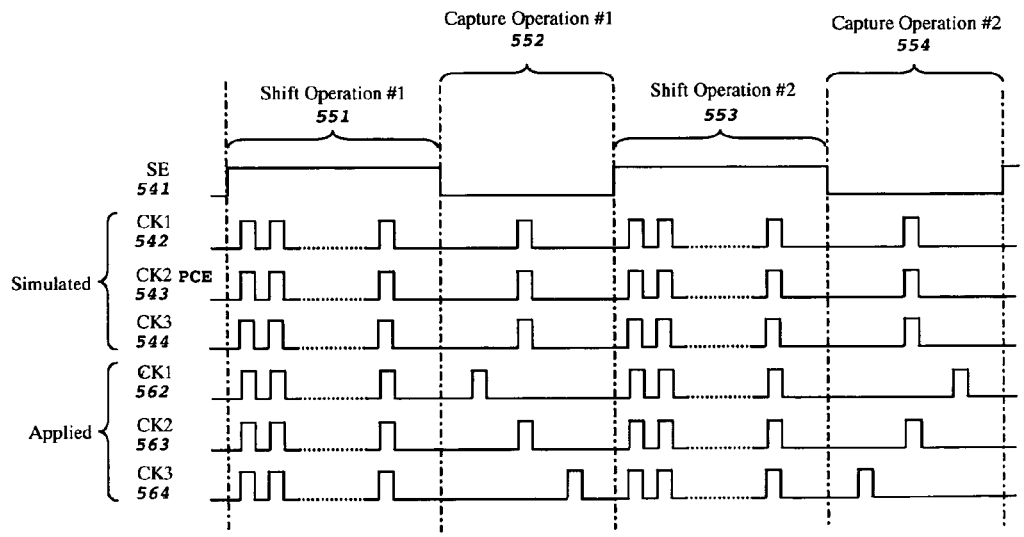

FIG. 5 shows a block diagram and timing diagram of a scan-based integrated circuit, used to implement prior-art solution #4 for performing ATPG and fault simulation using the primary capture event (PCE) approach proposed in the U.S. Pat. No. 6,195,776 by Ruiz et al. (2001). The block diagram of the scan-based integrated circuit comprises three clocks CK1 501, CK2 502 and CK3 503, three clock domains CD1 511, CD2 512 and CD3 513, three types of intra-clock-domain combinational logic 521, 522 and 523, and six types of inter-clock-domain combinational logic 531, 532, 533, 534, 535 and 536, as described in FIG. 1.

From the associated timing diagram, it can be seen that scan-test or self-test implemented based on the circuit expansion approach proceeds in a sequence of shift operations 551 and 553, and capture operations 552 and 554. During shift operations Shift Operation #1 551 and Shift Operation #2 553, clocks CK1 501, CK2 502 and CK3 503 are applied simultaneously as shown in waveforms 542/562, 543/563, and 544/564 respectively, while scan enable SE 541 is held active to configure all the scan cells in clock domains CD1 511, CD2 512 and CD3 513 into scan chains by selecting the scan data input as the input source for all scan cells in the scan-based integrated circuit, and a predetermined stimuli or a pseudorandom stimuli during scan-test and self-test, respectively, is shifted serially through the scan chains to all scan cells in the scan-based integrated circuit.

Figure 6:
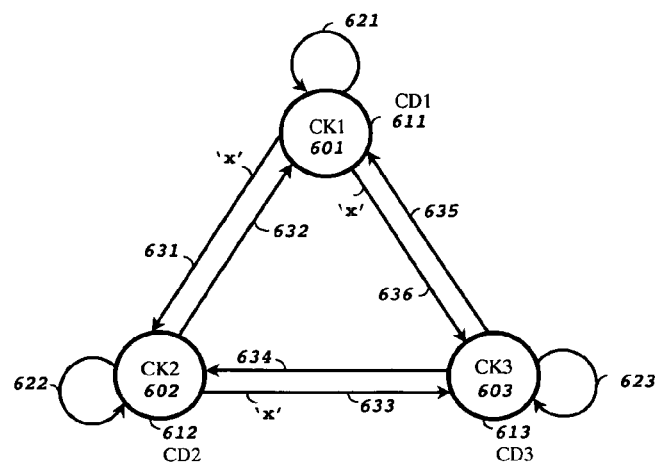
FIG. 6 shows a block diagram and a timing diagram of a scan-based integrated circuit, for performing ATPG and fault simulation according to the present invention.
Figure 6:
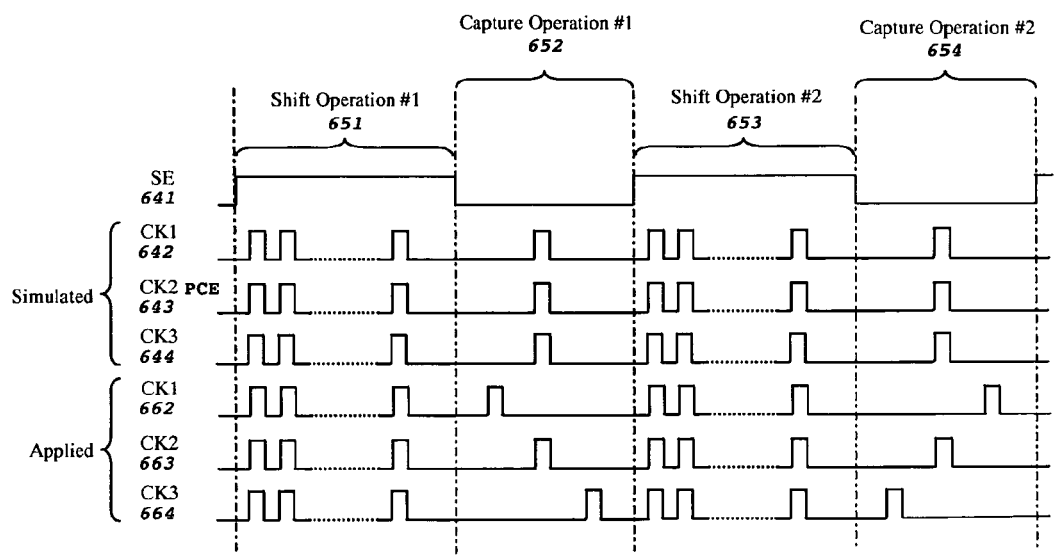

During capture operations Capture Operation #1 552 and Capture Operation #2 554, clocks CK1 501, CK2 502 and CK3 503 are applied sequentially as shown in waveforms 562, 563 and 564, while scan enable SE 541 is held inactive to select the data inputs as the input source for all scan cells in clock domains CD1 511, CD2 512 and CD3 513, to test the combinational logic of the scan-based integrated circuit using the stimulus loaded during the shift operation. However, during ATPG and fault simulation, clocks CK1 501, CK2 502 and CK3 503 are applied simultaneously as shown in waveforms 542, 543 and 544. In this example, CK2 502 is designated as the primary capture event (PCE), and a cycle-based logic simulator is used to perform a logic simulation with respect to the PCE clock, based on the clock order shown in waveforms 562, 563 and 564 during Capture Operation #1 552, which is CK1 501 followed by CK2 502 followed by CK3 503. In order to guarantee that the cycle-based logic simulator can accurately predict the results in the actual scan-based integrated circuit, all scan cells are analyzed with respect to the PCE clock to determine whether they can be controlled and observed at the time of the primary capture event. Since scan cells belonging to CD1 511 are driven by clock CK1 501, which is applied before the PCE clock, these scan cells are labeled as uncontrollable, since their values cannot be predicted at the time of the PCE, which results in unknown ('x') values being driven on intra-clock-domain combinational logic 521 and inter-clock-domain combinational-logic 531 and 536. Also, since scan cells belonging to CD3 513 are driven by clock CK3 503, which is applied after the PCE clock, these scan cells are labeled as unobservable, since their expected values cannot be predicted at the time of the PCE, which results in unknown ('x') values being observed on intra-clock-domain combinational logic 523 and inter-clock-domain combinational-logic 533 and 535. As illustrated in Capture Operation #2 554, different clock orders can be used, and different clocks can be designated as the PCE clock in order to be able to test all the combinational logic in the scan-based integrated circuit. FIG. 6 shows a block diagram and timing diagram of a scan-based integrated circuit, for performing ATPG and fault simulation according to the present invention. The block diagram of the scan-based integrated circuit comprises three clocks CK1 601, CK2 602 and CK3 603, three clock domains CD1 611, CD2 612 and CD3 613, three types of intra-clock-domain combinational logic 621, 622 and 623, and six types of inter-clock-domain combinational logic 631, 632, 633, 634, 635 and 636, as described in FIG. 1.

From the associated timing diagram, it can be seen that scan-test or self-test implemented based on the circuit expansion approach proceeds in a sequence of shift operations 651 and 653, and capture operations 652 and 654. During shift operations Shift Operation #1 651 and Shift Operation #2 653, clocks CK1 601, CK2 602 and CK3 603 are applied simultaneously as shown in waveforms 642/662, 643/663, and 644/664 respectively, while scan enable SE 641 is held active to configure all the scan cells in clock domains CD1 611, CD2 612 and CD3 613 into scan chains by selecting the scan data input as the input source for all scan cells in the scan-based integrated circuit, and a predetermined stimuli or a pseudorandom stimuli during scan-test and self-test, respectively, is shifted serially through the scan chains to all scan cells in the scan-based integrated circuit.

During capture operations Capture Operation #1 652 and Capture Operation #2 654, clocks CK1 601, CK2 602 and CK3 603 are applied sequentially as shown in waveforms 662, 663 and 664, while scan enable SE 641 is held inactive to select the data inputs as the input source for all scan cells in clock domains CD1 611, CD2 612 and CD3 613, to test the combinational logic of the scan-based integrated circuit using the stimulus loaded during the shift operation. However, during ATPG and fault simulation, clocks CK1 601, CK2 602 and CK3 603 are applied simultaneously as shown in waveforms 642, 643 and 644. A forward and backward clock analysis of all the nodes in the scan-based integrated circuit is performed to determine the driving and observing clocks of all inter-clock-domain combinational logic. This allows us to determine the precise nodes that need to be set as uncontrollable and unobservable based on the order of the clocks during the capture operation. The clock order shown in waveforms 662, 663 and 664 during Capture Operation #1 652 is CK1 601 followed by CK2 602 followed by CK3 603. Since inter-clock-domain combinational logic 631 is driven by CK1 601 and observed by CK2 602, nodes in this combinational logic are either labeled as uncontrollable or unobservable, since the values stored in scan cells belonging to clock domain CD1 611 which drive inter-clock domain combinational logic 631 may have changed after applying clock CK1 601. Similarly nodes in inter-clock-domain combinational logic 633 and 636 are also labeled as uncontrollable or unobservable. This guarantees that the cycle-based logic simulator can accurately predict the results in the actual scan-based integrated circuit. Please note that the number of intra-clock-domain combinational logic and inter-clock-domain combinational logic labeled as uncontrollable or unobservable is much less than the number used in prior-art solution #4, which reduces the number of vectors used to test the scan-based integrated circuit. As illustrated in Capture Operation #2 654, different clock orders can be used in order to be able to test all the combinational logic in the scan-based integrated circuit.

Figure 7:
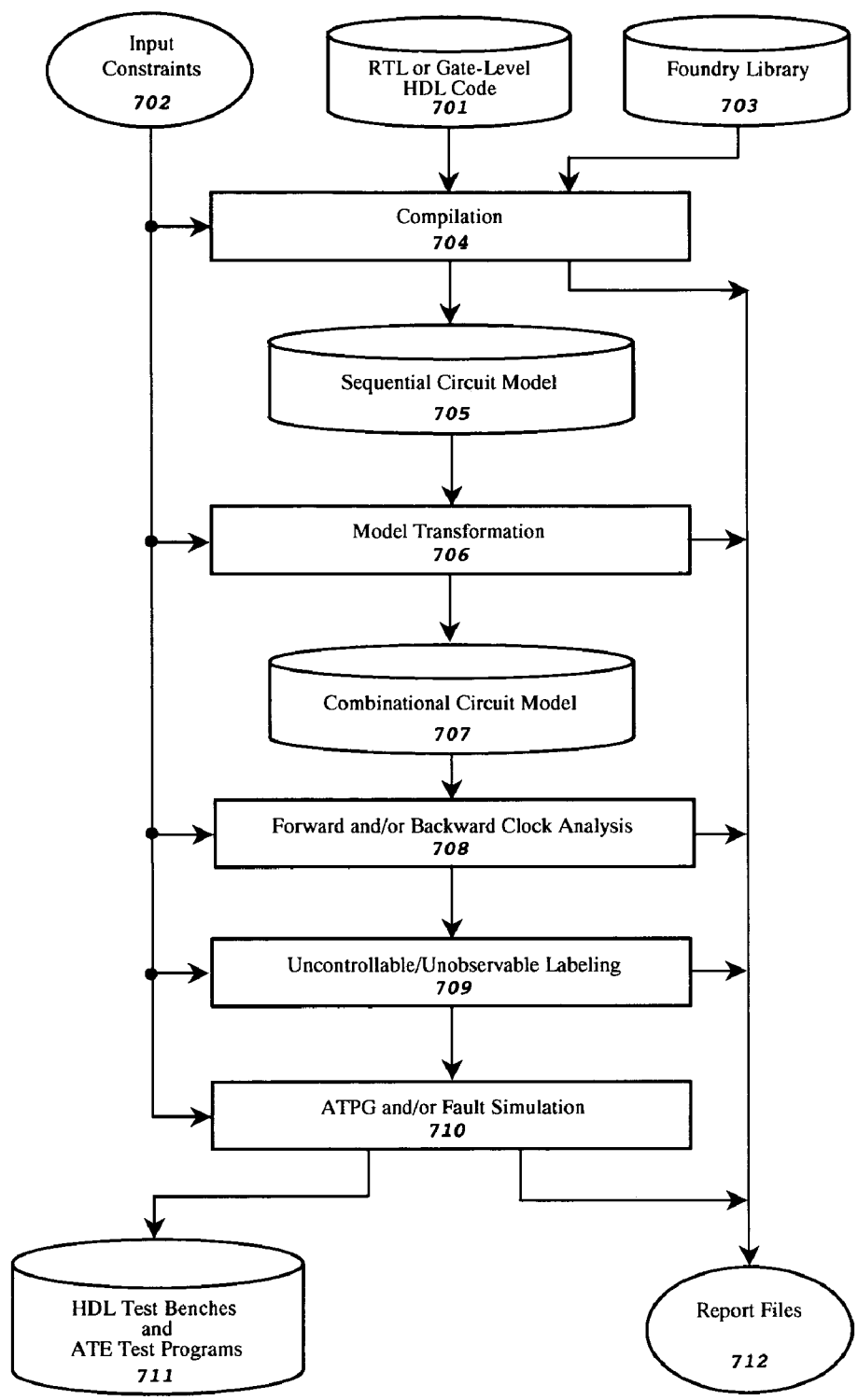
FIG. 7 shows a method for performing ATPG and fault simulation in a scan-based integrated circuit according to the present invention.

FIG. 7 shows a method for performing ATPG and fault simulation in a scan-based integrated circuit according to the present invention. In this method RTL or Gate-Level HDL code 701 is compiled 704 based on the Input Constraints 702 and a Foundry Library 703, into a Sequential Circuit Model 705. The Sequential Circuit Model 705 is then transformed 706 into an equivalent Combinational Circuit Model 707 for performing Forward and/or Backward Clock Analysis 708 to determine the driving and observing clocks for all inputs and outputs of all combinational logic gates in the Combinational Circuit Model 707, which is used for Uncontrollable/Unobservable Labeling 709 of selected inputs and outputs of the combinational logic gates. Finally, ATPG and/or Fault Simulation 710 are performed according to the Uncontrollable/Unobservable Labeling 709 to generate the HDL Test Benches and ATE Test Programs 711 and associated Report Files 712. The ATPG and/or Fault Simulation 710 can either comprise predetermined pattern ATPG and Fault Simulation during scan-test or pseudorandom pattern Fault Simulation during self-test.

Having thus described presently preferred embodiments of the present invention, it can now be appreciated that the objectives of the invention have been fully achieved. And it will be understood by those skilled in the art that many changes in construction and circuitry, and widely differing embodiments and applications of the invention will suggest themselves without departing from the spirit and scope of the present invention. The disclosures and the description herein are intended to be illustrative and are not in any sense limitation of the invention, more preferably defined in scope by the following claims.

What is claimed is:

1. A method for performing ATPG and fault simulation for testing faults in a scan-based integrated circuit, based on a selected clock order in a selected capture operation, in a selected scan-test mode or a selected self-test mode, the scan-based integrated circuit containing two or more clocks, a plurality of combinational logic gates, and one or more scan chains, each scan chain comprising one or more scan cells coupled in series; said method comprising:

(a) performing a forward and/or backward clock analysis on said scan-based integrated circuit to determine the driving and observing clocks for all inputs and outputs of said combinational logic gates belonging to said scan-based integrated circuit;

(b) labeling selected inputs and outputs of said combinational logic gates belonging to said scan-based integrated circuit as unobservable and/or uncontrollable according to said selected clock order in said selected capture operation to eliminate the effects of clock skew between different clock domains; and (c) performing ATPG and/or fault simulation on said scan-based integrated circuit according to said selected inputs and outputs of said combinational logic gates and said selected capture operation.

2. The method of claim 1, wherein said selected clock order in said selected capture operation is determined dynamically during said ATPG and fault simulation.

3. The method of claim 2, wherein said performing ATPG and/or fault simulation further comprises dynamically labeling said selected inputs and outputs of said combinational logic gates belonging to said scan-based integrated circuit as unobservable and/or uncontrollable according to said selected clock order in said selected capture operation.

4. The method of claim 1, wherein said selected clock order in said selected capture operation does not include one or more selected clocks belonging to said two or more clocks.

5. The method of claim 1, wherein said labeling selected inputs and outputs of said combinational logic gates belonging to said scan-based integrated circuit as unobservable and/or uncontrollable according to said selected clock order in said selected capture operation further comprises labeling second selected inputs and outputs of said combinational logic gates directly driven and observed by selected outputs and inputs of one or more selected scan cells, respectively.

6. The method of claim 1, wherein said labeling selected inputs and outputs of said combinational logic gates belonging to said scan-based integrated circuit as unobservable and/or uncontrollable according to said selected clock order in said selected capture operation further comprises reducing or eliminating the number of expected unknown ('x') values captured in said one or more scan cells.

7. The method of claim 1, wherein said performing a forward and/or backward clock analysis on said scan-based integrated circuit further comprises a circuit remodeling step to prevent third selected inputs and outputs of selected combinational logic gates belonging to said scan-based integrated circuit from being driven by multiple driving and/or observing clocks.

8. The method of claim 1, wherein said faults further include selected stuck-at faults, selected transition faults selectively launched from shift or launched from capture, selected path-delay faults selectively using launched from shift or launched from capture, selected IDDQ (IDD quiescent current) faults, and selected bridging faults.

9. The method of claim 1, wherein said performing ATPG and/or fault simulation on said scan-based integrated circuit further comprises selectively performing a predetermined pattern ATPG and fault simulation in said scan-test mode, or a pseudorandom pattern fault simulation in said self-test mode.

10. A computer-readable memory having computer-readable program code embodied therein for causing a computer system to perform a method for performing ATPG and fault simulation for testing faults in a scan-based integrated circuit, based on a selected clock order in a selected capture operation, in a selected scan-test mode or a selected self-test mode, the scan-based integrated circuit containing two or more clocks, a plurality of combinational logic gates, and one or more scan chains, each scan chain comprising one or more scan cells coupled in series; said method comprising the computer-implemented steps of:
 (a) compiling the HDL (hardware description language) code modeled at RTL (register-transfer level) or gate-level that represents said scan-based integrated circuit into a sequential circuit model according to selected input constraints and selected foundry library;
 (b) transforming said sequential circuit model into an equivalent combinational circuit model;
 (c) performing a forward and/or backward clock analysis on said scan-based integrated circuit to determine the driving and observing clocks for all inputs and outputs of said combinational logic gates belonging to said scan-based integrated circuit;
 (d) labeling selected inputs and outputs of said combinational logic gates belonging to said scan-based integrated circuit as unobservable and/or uncontrollable according to said selected clock order in said selected capture operation to eliminate the effects of clock skew between different clock domains; and
 (e) performing ATPG and/or fault simulation on said scan-based integrated circuit according to said selected inputs and outputs of said combinational logic gates and said selected capture operation.

\* \* \* \* \*